United States Patent [19]

Ohi et al.

[11] Patent Number: 5,523,596
[45] Date of Patent: Jun. 4, 1996

[54] SEMICONDUCTOR DEVICE HAVING CAPACITOR AND MANUFACTURING METHOD THEREFOR

[75] Inventors: Makoto Ohi; Hideaki Arima; Natsuo Ajika, all of Hyogo-ken, Japan

[73] Assignee: Mitsubishi Denki Kabushiki Kaisha, Tokyo, Japan

[21] Appl. No.: 403,614

[22] Filed: Mar. 14, 1995

Related U.S. Application Data

[63] Continuation of Ser. No. 767,327, Sep. 30, 1991.

[30] Foreign Application Priority Data

Oct. 5, 1990 [JP] Japan ................................ 2-268810

[51] Int. Cl.⁶ ............................................. H01L 27/108
[52] U.S. Cl. ........................ 257/296; 257/314; 257/411; 257/532
[58] Field of Search .................................. 257/296, 310, 257/314, 316, 411, 532

[56] References Cited

U.S. PATENT DOCUMENTS 4,907,046  3/1990  Ohji et al. ............................. 257/296
4,943,836  7/1990  Mori ....................................... 257/323
4,990,463  2/1991  Mori ......................................... 437/52

FOREIGN PATENT DOCUMENTS 0376685  7/1990  European Pat. Off. .
63-316456  12/1988  Japan .
2-16763  1/1990  Japan .

OTHER PUBLICATIONS

Ajika et al., "Enhanced Reliability of Native Oxide Free Capacitor Dielectrics on Rapid Thermal Nitrided Polysilicon", 1991 Symposium on VLSI Technology Digest of Technical Papers, pp. 63–64.

*Primary Examiner*—Mark V. Prenty
*Attorney, Agent, or Firm*—Lowe, Price, LeBlanc & Becker

[57] ABSTRACT

A capacitor includes a polycrystalline silicon layer 1 as a lower electrode layer, a dielectric layer 112, and a polycrystalline silicon layer 113 as an upper electrode layer. The dielectric layer 112 is formed by an oxynitride film 2, a silicon nitride film 3 and a top oxide film 4. A film thickness $t_3$ of the top oxide film 4 is controlled to be less than 20 Å. Capacitance of the capacitor can be increased while improving the duration of life of the dielectric layer, resulting in a highly reliable capacitor.

4 Claims, 15 Drawing Sheets

SEMICONDUCTOR DEVICE HAVING CAPACITOR AND MANUFACTURING METHOD THEREFOR

This application is a continuation of application Ser. No. 07/767,327 filed Sep. 30, 1991.

BACKGROUND OF THE INVENTION

Field of the Invention

The present invention relates generally to semiconductor devices having capacitors and a manufacturing method thereof, and more particularly, to an improved arrangement of a capacitor for use in a dynamic random access memory (DRAM) and manufacturing method therefor.

DESCRIPTION OF THE BACKGROUND ART

In recent years, with the remarkable spread of information equipment such as computers, there is an increasing demand for semiconductor memory devices. In particular, the requirements on semiconductor memory devices having large memory capacity and operable at a high speed become more demanding. Under such circumstances, technique must improve to achieve higher integration and higher response or higher reliability of semiconductor memory devices.

Semiconductor memory devices include a DRAM capable of inputting/outputting storage information at random. In general, a DRAM comprises a memory cell array as a storage region for storing a lot of pieces of storage information and a peripheral circuit required for inputting and outputting from/to the outside of the memory.

FIG. 1 is a block diagram showing an arrangement of a common DRAM. With reference to FIG. 1, a DRAM 150 comprises a memory cell array 151, a row and column address buffer 152, a row decoder 153 and a column decoder 154, a sense refresh amplifier 155, a data in buffer 156 and a data out buffer 157, and a clock generator 158. Memory cell array 151 serves to store data signals of storage information. Row and column address buffer 152 serves to receive external address signals $A_0$–$A_9$ for selecting memory cells constituting an unit storage circuit. Row decoder 153 and column decoder 154 serve to designate a memory cell by decoding an address signal. Sense refresh amplifier 155 serves to amplify and read a signal stored in a designated memory cell. Data in buffer 156 and data out buffer 157 serve to input/output data. Clock generator 158 serves to generate a clock signal as a control signal for each portion.

Memory cell array 151 occupying a large area of a semiconductor chip comprises a plurality of memory cells for storing unit storage information arranged in a matrix. FIG. 2 is a diagram showing an equivalent circuit of 4 bit memory cells constituting memory cell array 151. A memory cell is formed in the proximity of a cross-over point of a word line 104 and a bit line 115. The shown memory cell comprises one MOS (Metal Oxide Semiconductor) transistor 103 and one capacitor 110. In other words, each memory cell represents a so-called one transistor one capacitor type memory cell. With a simple structure, a memory cell of this type allows integration density thereof to be increased with ease, for which fact the memory cell is widely used in a DRAM with a large capacity.

Memory cells of a DRAM falls into several types according to an arrangement of a capacitor. FIG. 3 is a partial sectional view showing a sectional arrangement of a memory cell having a typical stacked type capacitor. With reference to FIG. 3, a memory cell comprises one transfer gate transistor 203 and one stacked type capacitor 210. Transfer gate transistor 203 includes a pair of source and drain regions 206, 206, and a gate electrode (word line) 204. Source/drain regions 206, 206 are formed at the surface of a silicon substrate 201. Gate electrode 204 is formed on silicon substrate 201 with a gate oxide film 205 provided therebetween. Capacitor 210 includes a lower electrode (storage node) 211, a dielectric layer 212 and an upper electrode (cell plate) 213. Lower electrode 211 extends from above gate electrode 204 towards above an insulating field oxide film 202, a part of which lower electrode is connected to one of source/drain regions 206, 206. Dielectric layer 212 is formed on the surface of lower electrode 211. Upper electrode 213 is formed on the surface of dielectric layer 212. A bit line 215 is formed on capacitor 210 with an interlayer insulation layer 220 provided therebetween. Bit line 215 is connected to the other of source/drain regions 206 through a contact hole 216. The stacked type capacitor is characterized in that a main part of the capacitor extends to above a gate electrode and a field oxide film to increase an area along which electrodes of the capacitor face to each other, thereby ensuring capacitance of the capacitor.

In general, capacitance of a capacitor is proportional to an area along which electrodes face to each other and inversely proportional to a thickness of a dielectric layer. It is therefore desirable to increase an area along which electrodes of a capacitor face to each other in view of an increase in capacitance of the capacitor. An increase in integration density of a DRAM is followed by a drastic reduction in a memory cell size. A plane area of a region in which a capacitor is formed decreases accordingly. In view of stable operation and reliability of a DRAM as a storage device, however, electric charges which 1-bit memory is capable of storing should not be reduced. For satisfying such contradictory requirements, various arrangements of a capacitor have been proposed which reduce a plane area of the capacitor, while increasing an area along which electrodes face to each other.

In view of increasing capacitance of a capacitor, a thickness of a dielectric layer of the capacitor is preferably small. In addition, high reliability is required of the dielectric layer. For such a capacitor, a polycrystalline silicon layer is used as an electrode layer and a silicon nitride film formed on the polycrystalline silicon layer and an oxide film formed by oxidizing the surface of the silicon nitride film are used as a dielectric layer. Such arrangement enables a film thickness of a dielectric layer to be reduced, thereby providing a capacitor with large capacitance and high reliability.

FIG. 4 is a partial sectional view showing an arrangement of a conventional capacitor. With reference to FIG. 4, an interlayer insulation layer 220 is formed on a silicon substrate 201. A polycrystalline silicon layer 11 constituting a lower electrode layer of the capacitor is formed on interlayer insulation layer 220. Polycrystalline silicon layer 11 is doped with impurities. A natural oxide film 12 is formed on polycrystalline silicon layer 11. A silicon nitride film 13 is formed on natural oxide film 12 by a low pressure CVD method. Oxidation of the surface of silicon nitride film 13 results in an oxide film 14. As described in the foregoing, the dielectric layer of the capacitor comprises natural oxide film 12, silicon nitride film 13 and oxide film 14. A polycrystalline silicon layer 15 constituting an upper electrode layer of the capacitor is formed on oxide film 14.

The capacitor arrangement of a DRAM as shown in FIG. 4 has the following shortcomings. FIG. 6 shows a schematic arrangement of a CVD device for use in forming silicon nitride film 13 constituting a capacitor dielectric layer. In the capacitor shown in FIG. 4, a lower electrode layer is formed by polycrystalline silicon layer 11. Reaction of the surface of polycrystalline silicon layer 11 with water or oxygen in the air results in natural oxide film 12 having a film thickness of about 10 Å formed on polycrystalline silicon layer 11. Thereafter, when in forming silicon oxide film 13 on polycrystalline silicon layer 11 by a CVD method, a wafer 73 is automatically inserted in a CVD furnace 71 by mechanical carrying as shown in FIG. 6. At this time, the outer peripheral portion of CVD furnace 71 is heated by a heater 72. At this time of automatic insertion, the air is taken into CVD furnace 71 together with wafer 73. With the temperature of CVD furnace 71 as high as above 400° C., polycrystalline silicon layer 11 constituting a lower electrode layer of the capacitor reacts with oxygen in the air, which layer is further oxidized through natural oxide film 12. As a result, after the formation of silicon nitride film 13, undesirably thick oxide film 12 is formed on polycrystalline silicon layer 11, resulting in silicon nitride film 13 formed on oxide film 12.

The above-described undesirably thick oxide film 12 increases the thickness of the dielectric layer provided between the polycrystalline silicon layers 11 and 15, which not only causes reduction in capacitance of the capacitor but also reduces reliability of the dielectric layer.

The improved arrangement of a capacitor to solve the above-described problem is disclosed in Japanese Patent Laying-Open No. 2-16763. FIG. 5 is a partial sectional view showing the arrangement of the capacitor disclosed in the above-described official gazette. An oxide film 220 as an interlayer insulation layer is formed on a silicon substrate 201. A polycrystalline silicon layer 11 constituting a lower electrode layer is formed on oxide film 220. Polycrystalline silicon layer 11 is doped with phosphorus as impurities. Silicon substrate 201, with polycrystalline silicon layer 11 formed thereon, left at a room temperature results in a formation of a natural oxide film of about 5–10 Å thick on the surface of polycrystalline silicon layer 11. In this arrangement of a capacitor, however, a nitride film 22 is formed by rapidly nitriding the natural oxide film formed on the surface of polycrystalline silicon layer 11. This rapid nitridation is done by rapid thermal annealing (RTA) in $NH_3$ atmosphere at a temperature 950°–1150° C. This method rapidly nitrides a natural oxide film, avoiding growth of the film due to natural oxidization. A natural oxide film having a thickness of about 5–10 Å grown on the surface of polycrystalline silicon layer 11 can be nitrided. A silicon nitride film 13 of 80 Å thick is formed by a low pressure CVD method on thus formed nitride film 22. Oxidization of the surface of silicon nitride film 13 results in an oxide film 14 having a film thickness of about 20 Å. A polycrystalline silicon layer 15 constituting an upper electrode layer is formed on oxide film 14.

As described above, a thin natural oxide film formed on the surface of polycrystalline silicon layer 11 is made into nitride film 22 by rapid nitridation method. Therefore, when in forming silicon nitride film 13 by the low pressure CVD method at a later step, growth of an oxide film on the surface of polycrystalline silicon layer 11 can be prevented at the time of inserting a wafer into the CVD furnace. As a result, reduction in capacitance of a capacitor due to growth of a natural oxide film can be suppressed. The arrangement of a capacitor shown in FIG. 5 is also disclosed in Japanese Patent Laying-Open No. 63-16465.

In the capacitor arrangement shown in FIG. 5, top oxide film 14 constituting a dielectric layer is formed to have a relatively large thickness of about 20 Å. In addition, polycrystalline silicon layer 15 as an upper electrode layer is formed on top oxide film 14 by the low pressure CVD method used also in forming silicon nitride film 13. Therefore, after the formation of top oxide film 14, top oxide film might grow to have an increased film thickness before a formation of polycrystalline silicon layer 15. As a result, the increase in the film thickness of the entire dielectric layer not only decreases capacitance of the capacitor but also reduces reliability of the dielectric layer. The above-described official gazette fails to disclose formation of top oxide film 14 in consideration of such problem.

SUMMARY OF THE INVENTION

One object of the present invention is to increase capacitance of a capacitor by controlling a thickness of a top oxide film constituting a dielectric layer of the capacitor.

Another object of the present invention is to enhance reliability of a capacitor by controlling a thickness of a top oxide film constituting a dielectric layer of the capacitor.

Still another object of the present invention is to increase a duration of life of a dielectric layer constituting a capacitor.

A further object of the present invention is to provide an arrangement of a capacitor applicable to a DRAM and suitable for high integration.

A further object of the present invention is to manufacture a capacitor capacitance of which can be increased.

A further object of the present invention is to manufacture a capacitor with increased reliability.

A further object of the present invention is to manufacture a capacitor having a long duration of life.

A further object of the present invention is to manufacture a capacitor applicable to a DRAM and suitable for miniaturization.

A further object of the present invention is to control a film thickness of a top oxide film constituting a dielectric layer of a capacitor.

A semiconductor device having a capacitor according to one aspect of the present invention includes a first electrode layer, a dielectric layer and a second electrode layer. The first electrode layer is formed on a semiconductor substrate. The dielectric layer is formed on the first electrode layer. The second electrode layer is formed on the dielectric layer. The dielectric layer includes an oxynitride film, a nitride film and an oxide film. The oxynitride film is formed on the first electrode layer. The nitride film is formed on the oxynitride film. The oxide film is formed on the nitride film, with a thickness controlled to be less than 20 Å.

According to a method of manufacturing a semiconductor device having a capacitor according to another aspect of the present invention, a first electrode layer is first formed on a semiconductor substrate. An oxynitride film is first formed on the first electrode layer. A nitride film is formed on the oxynitride film. An oxide film having a film thickness controlled to be less than 20 Å is formed on the nitride film. A second electrode layer is formed on the oxide film.

A semiconductor device having a capacitor according to still another aspect of the present invention includes a first electrode layer, a dielectric layer and a second electrode layer. The dielectric layer includes an oxynitride film, a nitride film and an oxide film. The oxide film is formed on the nitride film so as to reduce the defect of the nitride film and not to reduce a duration of life time of insulation of the dielectric layer as a whole.

According to a method of manufacturing a semiconductor device having a capacitor in accordance with a further aspect of the present invention, an oxide film is formed on a nitride film by thermal oxidization. After the formation of the oxide film, a semiconductor substrate is placed under an inert gate atmosphere. Thereafter, a second electrode layer is formed on the oxide film.

In the semiconductor device according to the present invention, a thickness of a top oxide film constituting a dielectric layer of a capacitor is controlled to be less than 20 Å. Therefore, an increase of the top oxide film thickness does not cause reduction in capacitance of the capacitor. With the film thickness of the top oxide film being controlled to be less than 20 Å, it is possible to ensure a long duration of life time of a dielectric layer. Thus, the semiconductor device according to the present invention allows an increase in capacitance of the capacitor, while improving reliability of the capacitor.

The method of manufacturing a semiconductor device according to the present invention suppresses growth of a top oxide film constituting a dielectric layer of a capacitor. Thus, it is possible to control the thickness of the top oxide film in order to prevent a reduction in capacitance of the capacitor and ensure a long duration of life time of the dielectric layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
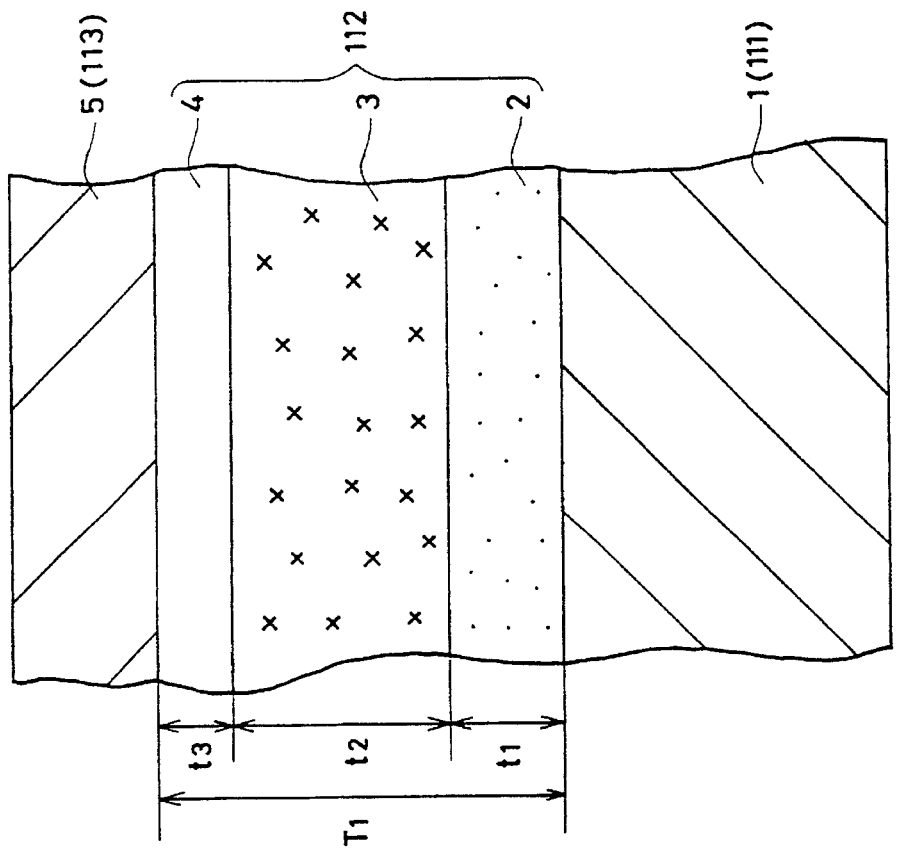
FIG. 7 is a partial sectional view showing an arrangement of a capacitor according to one embodiment of the present invention.

With reference to FIG. 7, an arrangement of a capacitor according to one embodiment of the present invention will be described. An oxynitride (also called nitrided oxide) film 2 is formed on a polycrystalline silicon layer 1 with impurities doped therein as a lower electrode layer of the capacitor. Oxynitride film 2 has a thickness of 5 Å or more, for example. A silicon nitride film 3 is formed on oxynitride film 2. The film thickness of silicon nitride film 3 corresponds to desired capacitance of the capacitor and it is, for example, about 20 Å–50 Å. A top oxide film 4 is formed on silicon nitride film 3. Top oxide film 4 has a film thickness controlled to be less than 20 Å. A polycrystalline silicon layer 5 constituting an upper electrode layer of the capacitor is formed on top oxide film 4. As described in the foregoing, a dielectric layer 112 comprises oxynitride film 2, silicon nitride film 3 and top oxide film 4.

Figure 8:
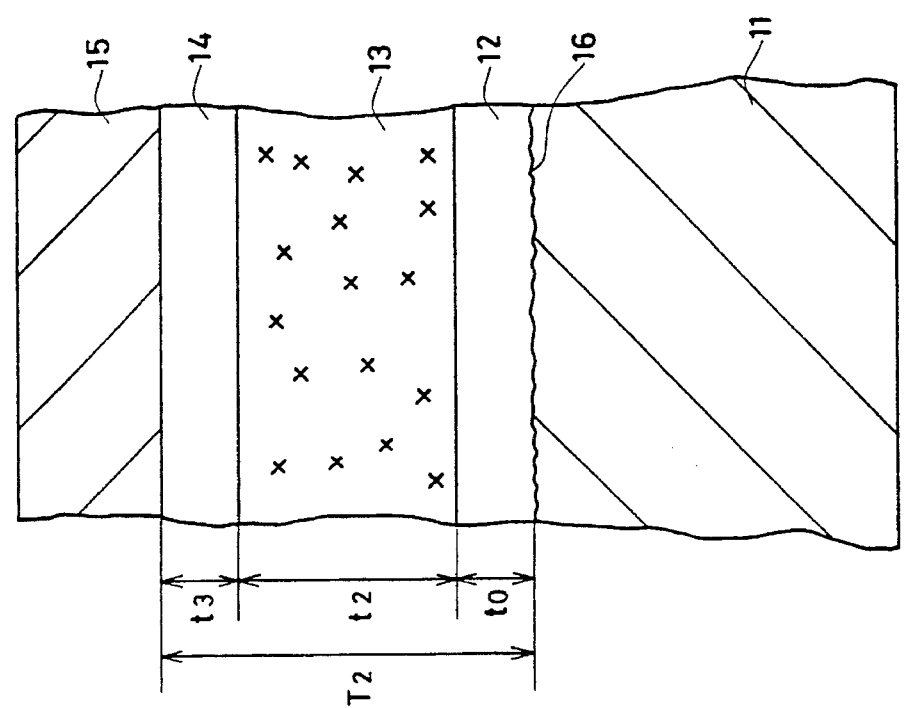
FIG. 8 is a partial sectional view showing a conventional capacitor to be compared with the arrangement of the capacitor according to the present invention.

Description will be made of the advantages of the capacitor arrangement according to the present invention over the conventional capacitor arrangement shown in FIG. 8. As shown in FIG. 8, a natural oxide film 12 is formed on a polycrystalline silicon layer 11 constituting a lower electrode layer in the conventional capacitor arrangement. A silicon nitride film 13 is formed on natural oxide film 12. An oxide film 14 is formed on silicon nitride film 13. A polycrystalline silicon layer 15 constituting an upper electrode layer is formed on oxide film 14.

It is assumed that the thicknesses of the dielectric layers of the capacitors arranged as shown in FIGS. 7 and 8 are $T_1$ and $T_2$, respectively. In addition, the thicknesses of the films constituting the respective dielectric layers are set as follows. The thickness of natural oxide film 12 is represented as $t_0$, that of oxynitride film 2 as $t_1$, that of silicon nitride film 3, 13 as $t_2$ and that of top oxide film 4, 14 as $t_3$. The thickness $T_1$ of the dielectric layer of the capacitor according to the present invention is expressed by the following equation.

$$T_1 = t_1 + t_2 + t_3$$

The thickness $T_2$ of the dielectric layer of the conventional capacitor is expressed by the following equation.

$$T_2 = t_0 + t_2 + t_3$$

It is assumed herein that $t_{\mathit{eff}1}$ represents the thickness converted into a thickness of an $SiO_2$ layer having the same capacitance as that of the dielectric layer of the capacitor of the present invention and $t_{\mathit{eff}2}$ represents the thickness converted into a thickness of an $SiO_2$ layer having the same capacitance as that of the dielectric layer of the conventional capacitor. $t_{eff1}$ and $t_{eff2}$ are expressed by the following equations, wherein $\epsilon_O$ denotes a dielectric constant of the silicon oxide film and $\epsilon_N$ denotes a dielectric constant of the silicon nitride film.

$$t_{eff1} = \frac{\epsilon_O}{\epsilon_N} t_1 + \frac{\epsilon_O}{\epsilon_N} t_2 + t_3$$

$$t_{eff2} = t_0 + \frac{\epsilon_O}{\epsilon_N} t_2 + t_3$$

Since $\epsilon_O < \epsilon_N$, when $t_0 \geq t_1$, $$t_0 > \frac{\epsilon_O}{\epsilon_N} t_1$$

is always established. That is, the capacitor arrangement according to the present invention shown in FIG. 7 has $t_{eff1}$ of the dielectric layer smaller than $t_{eff2}$ of the conventional dielectric layer by forming an oxynitride film 2 having a film thickness the same as or smaller than the film thickness $t_0$ of natural oxide film 12 in the conventional capacitor arrangement shown in FIG. 8. This implies that capacitance of the capacitor according to the present invention is larger than that of a conventional capacitor even if the film thickness $T_1$ of the dielectric layer of the present invention is the same as the film thickness $T_2$ of the conventional dielectric layer.

It is assumed herein that the capacitors shown in FIGS. 7 and 8 have the same capacitance. That is, $t_{eff1} = t_{eff2}$. At this time, since $$t_0 = \frac{\epsilon_O}{\epsilon_N} t_1$$

and $\epsilon_O < \epsilon_N$, $t_0 < t_1$ is established.

That is, when the conventional capacitor has the same capacitance as that of the capacitor according to the present invention, $T_1 > T_2$ is established.

$$\begin{aligned} \Delta T &= T_1 - T_2 \\ &= t_1 - t_0 \\ &= \frac{\epsilon_N - \epsilon_O}{\epsilon_O} \cdot t_0 \text{ (cm)} \end{aligned}$$

Assuming that a dielectric breakdown field strength of the silicon oxide film is represented as b (V/cm), a dielectric breakdown voltage of the dielectric layer according to the present invention is increased by $$\left( b \cdot \frac{\epsilon_N - \epsilon_O}{\epsilon_O} \cdot t_0 \right)$$

As described in the foregoing, even with the same capacitance as that of the conventional capacitor, the capacitor arranged according to the present invention has an increased dielectric breakdown voltage, which gives sufficient reliability to the capacitor.

Figure 1:
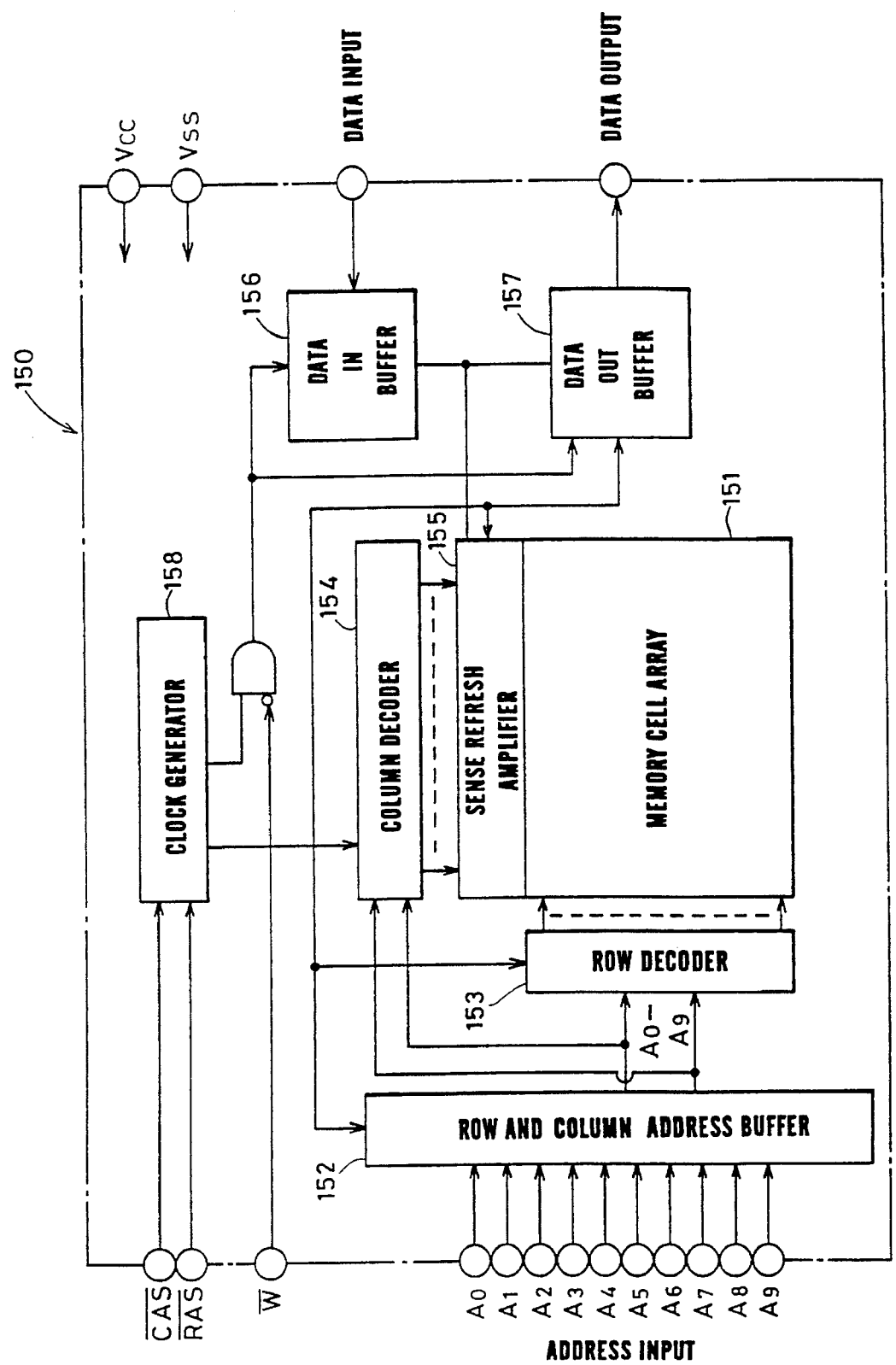
FIG. 1 is a blow diagram showing an entire arrangement of a conventional DRAM.
Figure 2:
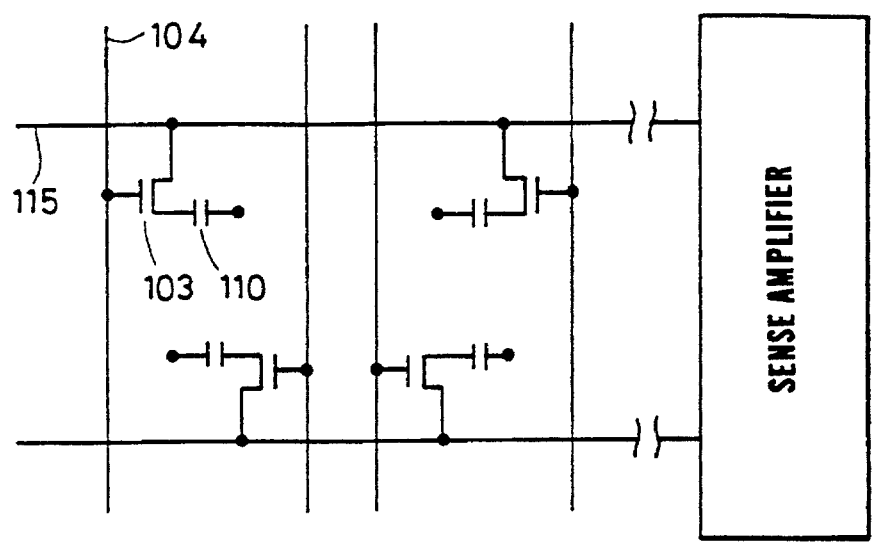
FIG. 2 is an equivalent circuit diagram showing a sense amplifier and 4 bit memory cells of a memory cell array for use in the DRAM shown in FIG. 1.
Figure 3:
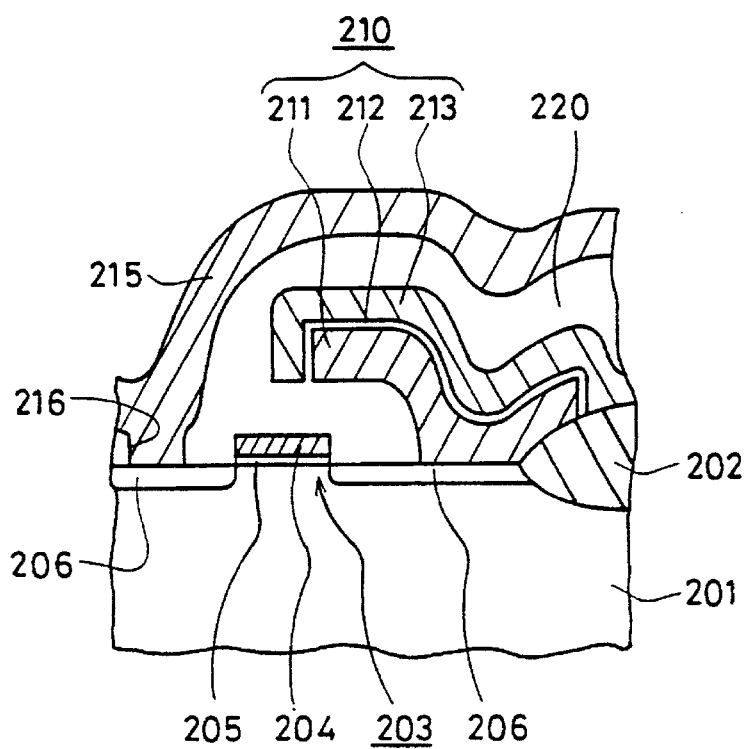
FIG. 3 is a partial sectional view showing a memory cell comprising a conventional stacked type capacitor.
Figure 4:
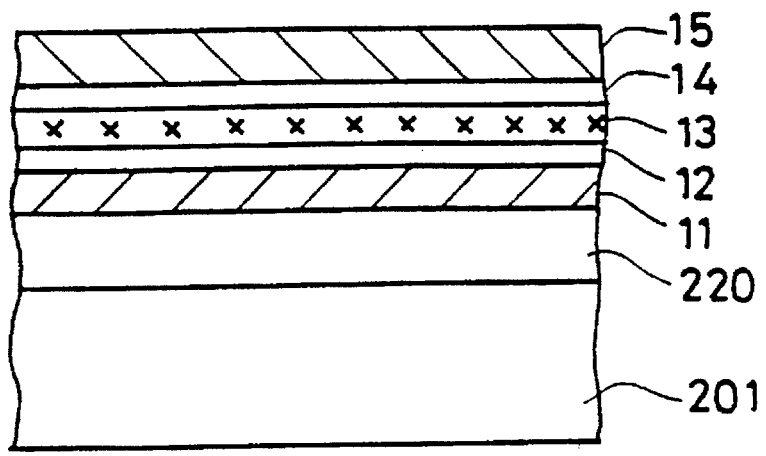
FIG. 4 is a partial sectional view showing an arrangement of a conventional capacitor.
Figure 5:
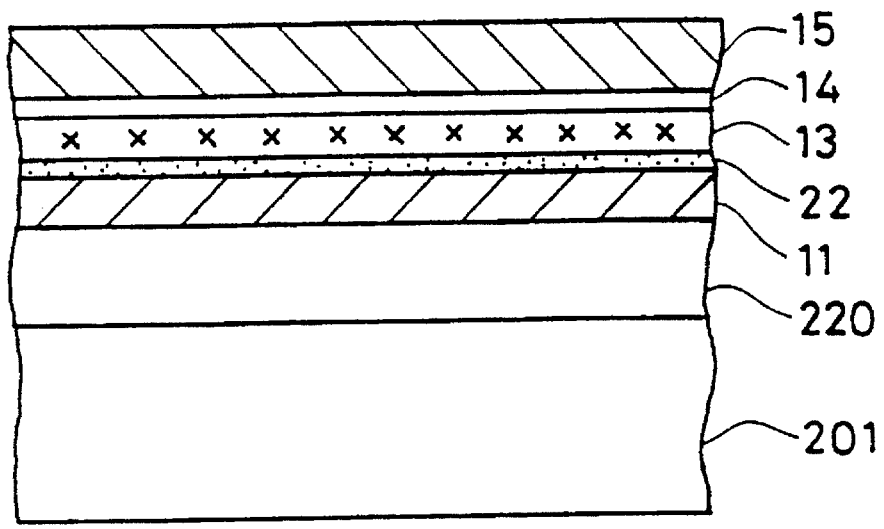
FIG. 5 is a partial sectional view showing a capacitor according to one prior art directed to improving the arrangement of the capacitor shown in FIG. 4.
Figure 6:
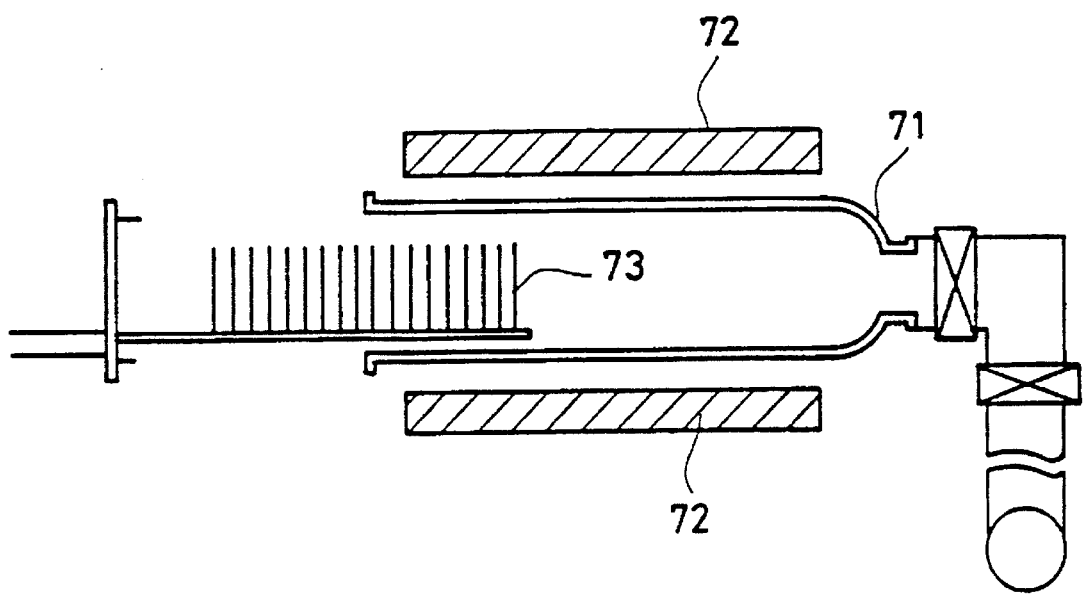
FIG. 6 is a schematic diagram showing a conventional CVD device for use in forming a dielectric layer of a capacitor.
Figure 9:
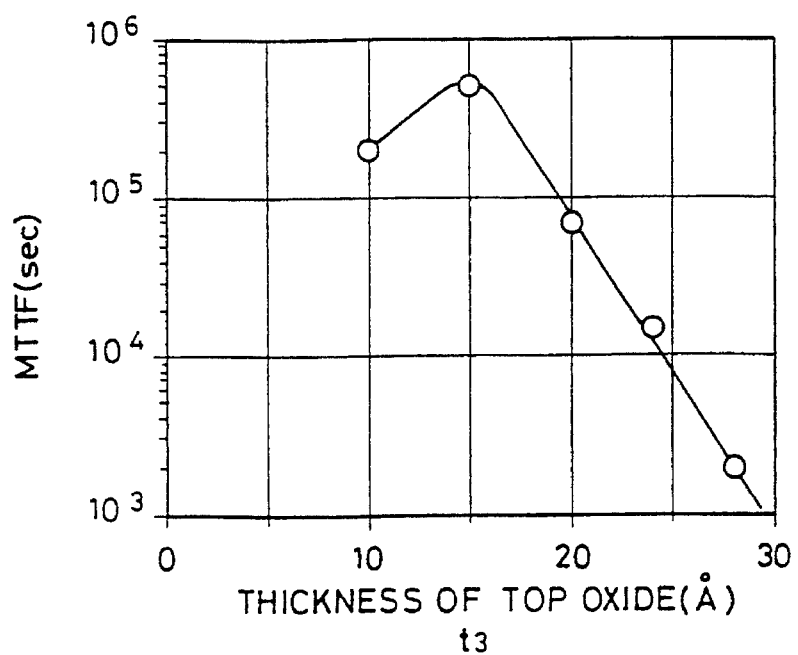
FIG. 9 is a graph showing a relationship between a film thickness of a top oxide film and a duration of life of a dielectric layer in the arrangement of the capacitor according to the present invention.

FIG. 9 shows a result of an acceleration test in which the film thickness $t_3$ of top oxide film 4 is changed and a fixed strong electric field is applied to dielectric layer 112 to cause dielectric breakdown for a short time period, with the film thickness $t_1$ of oxynitride film 2 and the film thickness $t_2$ of silicon nitride film 3 fixed in the capacitor arrangement shown in FIG. 7. The abscissa of FIG. 9 represents the film thickness $t_3$ (Å) of top oxide film 4 and the ordinate thereof represents MTTF (sec) as the duration of life of dielectric layer 112. The duration of life of a dielectric layer is represented as a time period (sec) till 30% of all the capacitors dielectrically break down on condition that electric field strength of 14 MV/cm is applied to the capacitors. As is clear from FIG. 9, the duration of life of the dielectric layer is on the order of $10^5$ (sec) in the range wherein the film thickness $t_3$ of top oxide film 4 increases up to 15 Å. However, after the film thickness $t_3$ of top oxide film 4 exceeds 15 Å, the duration of life of the dielectric layer decreases to be as low as 200 (sec) when the film thickness $t_3$ is 28 Å. As is clear from this result, the film thickness $t_3$ of a top oxide film should be limited to be less than 20 Å in order to ensure about a 10-year or longer duration of life of insulation in a practical use. In the capacitor arrangement according to the present invention, the film thickness $t_3$ of top oxide film 4 constituting a dielectric layer is controlled to be less than 20 Å in consideration of the foregoing. Therefore, as compared with the prior art capacitor shown in FIG. 5 having top oxide film 14 with a film thickness of about 20 Å, the dielectric layer of the capacitor according to the present invention has a longer duration of life of insulation. In addition, capacitance of the capacitor according to the present invention can be further increased because top oxide film 4 in the dielectric layer of the capacitor is made thin.

Figure 10:
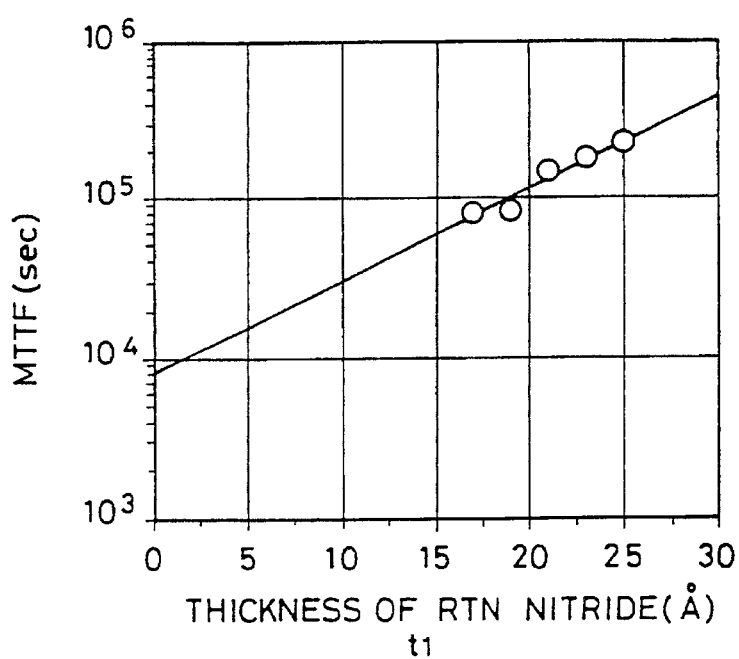
FIG. 10 is a graph showing a relationship between a film thickness of an oxynitride film and a duration of life of the dielectric layer in the arrangement of the capacitor according to the present invention.

FIG. 10 shows a result of the acceleration test in which the film thickness $t_1$ of oxynitride film (RTN nitride film) 2 is changed, and fixed strong electric field is applied to dielectric layer 112 to cause dielectric breakdown for a short time period, with the film thickness $t_2$ of silicon nitride film 3 and the film thickness $t_3$ of top oxide film 4 fixed in FIG. 7. The abscissa of FIG. 10 represents the film thickness $t_1$ (Å) of oxynitride film 2 and the ordinate represents MTTF (sec) as a duration of life of the dielectric layer. The definition of the duration of life of the dielectric layer and the conditions of the acceleration test are the same as those of FIG. 9. As the film thickness $t_1$ of oxynitride film 2 increases, so does the duration of life of the dielectric layer as is clear from FIG. 10. More specifically, when the film thickness $t_1$ increases from 17 Å to 25 Å, the duration of life of the dielectric layer quadruples. This result implies that the film thickness $t_1$ of oxynitride film 2 exceeding about 15 Å ensures a 10-year or longer duration of insulation life of the dielectric layer of the capacitor in a practical use.

In addition, top oxide film 4 serves to reduce the defect of silicon nitride film 3. The film thickness $t_3$ of top oxide film 4 should be 5 Å or more to serve this function effectively.

As shown in FIG. 8, irregularities 16 exist at the interface between natural oxide film 12 and polycrystalline silicon layer 11. As shown in FIG. 7, however, the formation of oxynitride film 2 as a result of rapid thermal nitridation of the natural oxide film smooth the interface between oxynitride film 2 and polycrystalline silicon layer 1. This is because the nitridation extends into polycrystalline silicon layer 1 during the rapid thermal nitridation of the natural oxide film. As described above, smoothing the interface between polycrystalline silicon layer 1 and oxynitride film 2 constituting the lower electrode layer of the capacitor stabilizes the electric characteristics of the capacitor.

With reference to FIGS. 11A to 11F, a method of manufacturing the capacitor shown in FIG. 7 will be described.

Figure 11A:
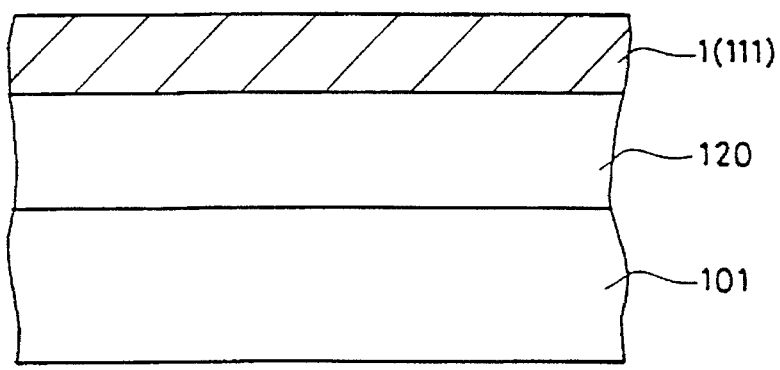
FIGS. 11A, 11B, 11C, 11D, 11E and 11F are partial sectional views of the capacitor at the respective manufacturing steps according to the present invention.

As shown in FIG. 11A, an interlayer insulation layer 120 comprising of an oxide film or the like is formed on a silicon substrate 101. A polycrystalline silicon layer 1 constituting a lower electrode layer of the capacitor is formed on interlayer insulation layer 120 by a low pressure CVD method. Polycrystalline silicon layer 1 is doped with impurities such as phosphorus.

Figure 11B:
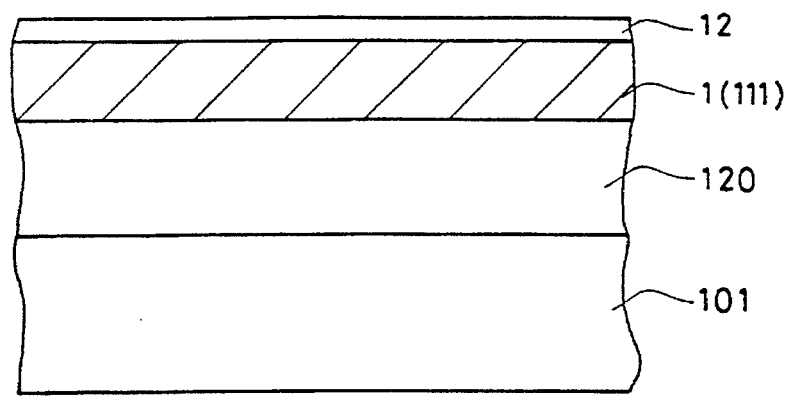

With reference to FIG. 11B, a natural oxide film 12 is formed on the surface of polycrystalline silicon layer 1.

Figure 11C:
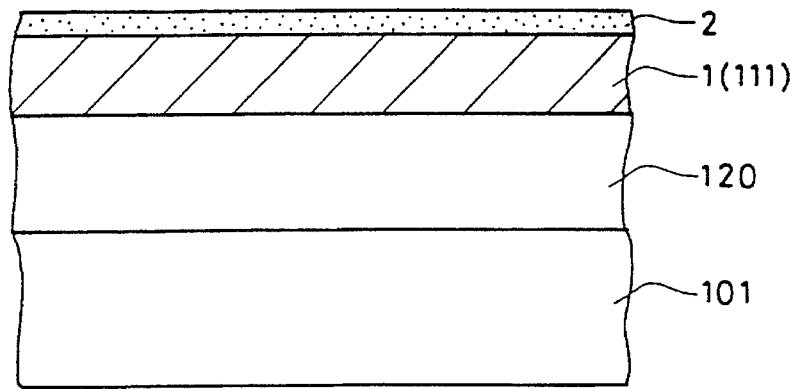

As shown in FIG. 11C, an oxynitride film 2 is formed as a result of rapid thermal nitridation of natural oxide film 12.

Figure 12:
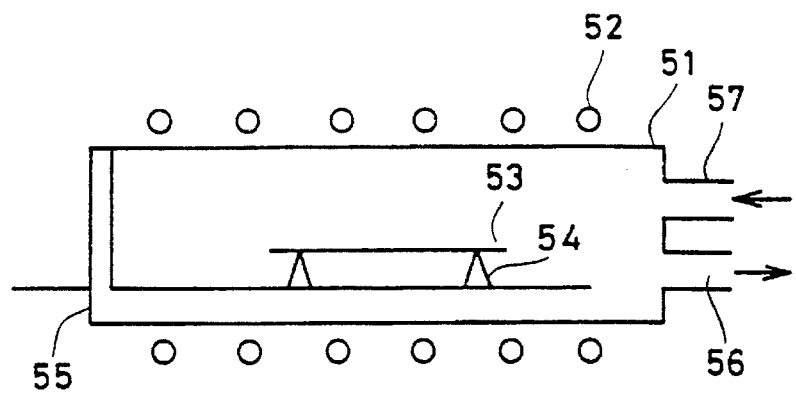
FIG. 12 is a schematic diagram showing an arrangement of a lamp annealing device for use in forming an oxynitride film in a step of manufacturing a capacitor according to the present invention.

The rapid thermal nitridation is carried out by using a lamp annealing device shown in FIG. 12. As shown in FIG. 11B, silicon substrate 101 on which natural oxide film 12 is formed is arranged, in the form of a wafer 53, on a susceptor 54. After inserting wafer 53 in a reaction tube 51, a lid 55 is put on. The pressure in reaction tube 51 is lowered by discharging gas from an exhaust port 56 and then NH₃ gas is introduced into reaction tube 51 through a reaction gas port 57. Wafer 53 is heated by a halogen lamp 52 with NH₃ flowing in reaction tube 51, thereby causing reaction of the surface of wafer 53 with NH₃ gas. This process is carried for about 30 seconds at a temperature of 850°–1050° C. As a result, natural oxide film 12 is rapidly thermal-nitrided to be changed into oxynitride film 2.

Figure 13A:
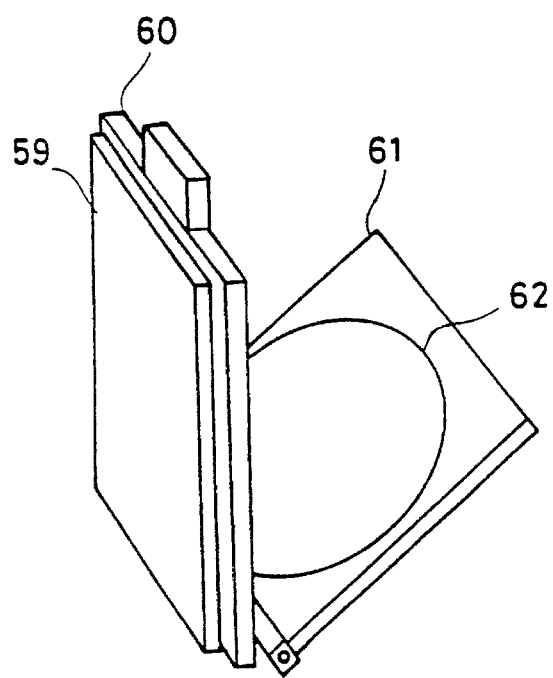
FIG. 13(a)–(b) are a schematic diagram showing a device according to another embodiment for use in forming an oxynitride film at a step of manufacturing a capacitor according to the present invention.
Figure 13B:
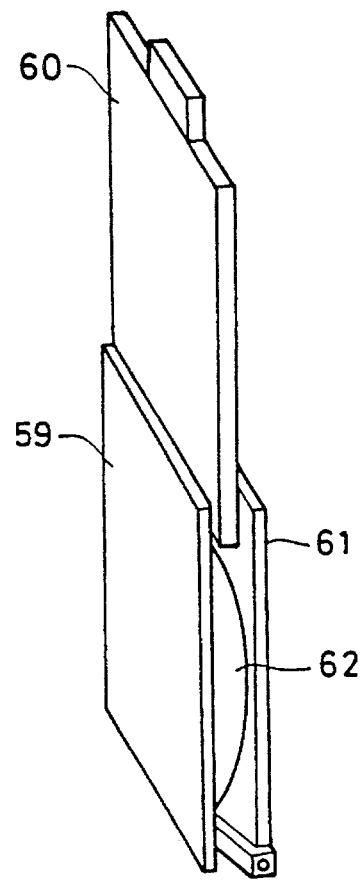

The above-described rapid thermal nitriding is carried out by using the device shown in FIG. 13. With reference to FIG. 13 (A), a wafer 62 is loaded onto a susceptor 61. With a carbon heater 59 of 10×10 cm heated, wafer 62, together with susceptor 61, is moved toward carbon heater 59 to a distance of 1–2 cm from the carbon heater as shown in FIG. 13 (B). With wafer 62 placed in parallel to carbon heater 59, photon is applied to wafer 62 by black body radiation while a shutter 60 is opened. Natural oxide film 12 on the surface of polycrystalline silicon layer 1 is heated by the above-described method while flowing nitride gas in the chamber to cause nitridation which results in formation of oxynitride film 2.

Figure 11D:
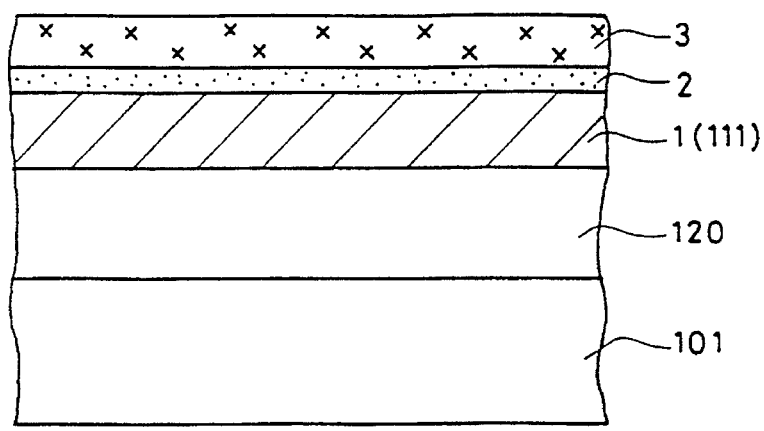
Figure 11E:
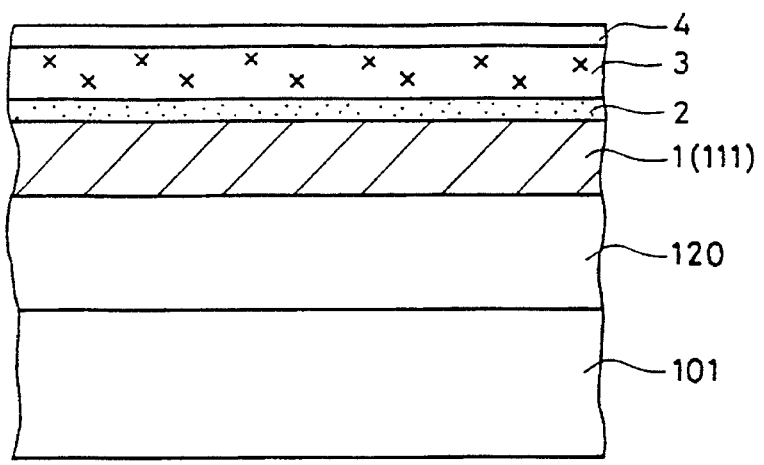

Then, as shown in FIG. 11D, a silicon nitride film 3 is formed on oxynitride film 2 by a low pressure CVD method.

Thereafter, a thermal oxidation process is carried out under an atmosphere including water vapor at a temperature of 800° C. or above to oxidize the surface of silicon nitride film 3 as shown in FIG. 11. As a result, a top oxide film 4 is formed. Thereafter, silicon substrate 101 with top oxide film formed thereon is placed under an inert gas atmosphere such as nitrogen. Then, the temperature of the inert gas atmosphere is lowered to a predetermined temperature. Such process suppresses growth of top oxide film 4, thereby controlling the film thickness of the same to be less than 20 Å.

Figure 11F:
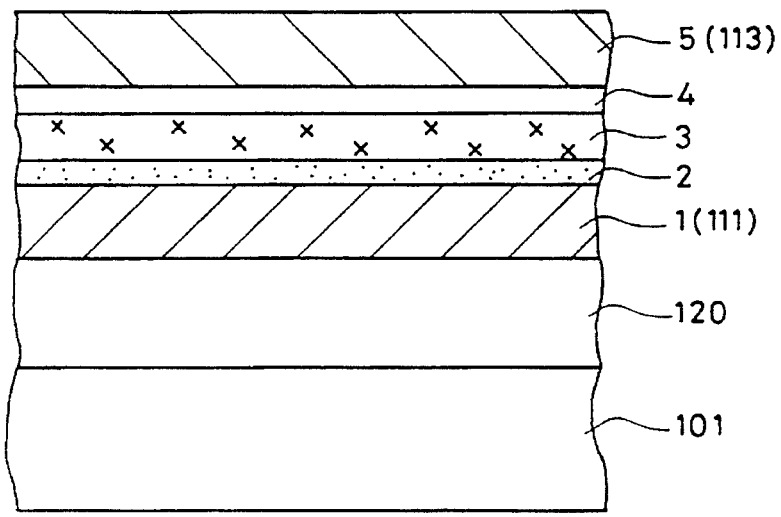

Finally, a polycrystalline silicon layer 5 is formed on top oxide film 4 by a low pressure CVD method as shown in FIG. 11F. Polycrystalline silicon layer 5 is doped with impurities such as phosphorus. The capacitor according to the present invention is manufactured in this way.

Figure 14:
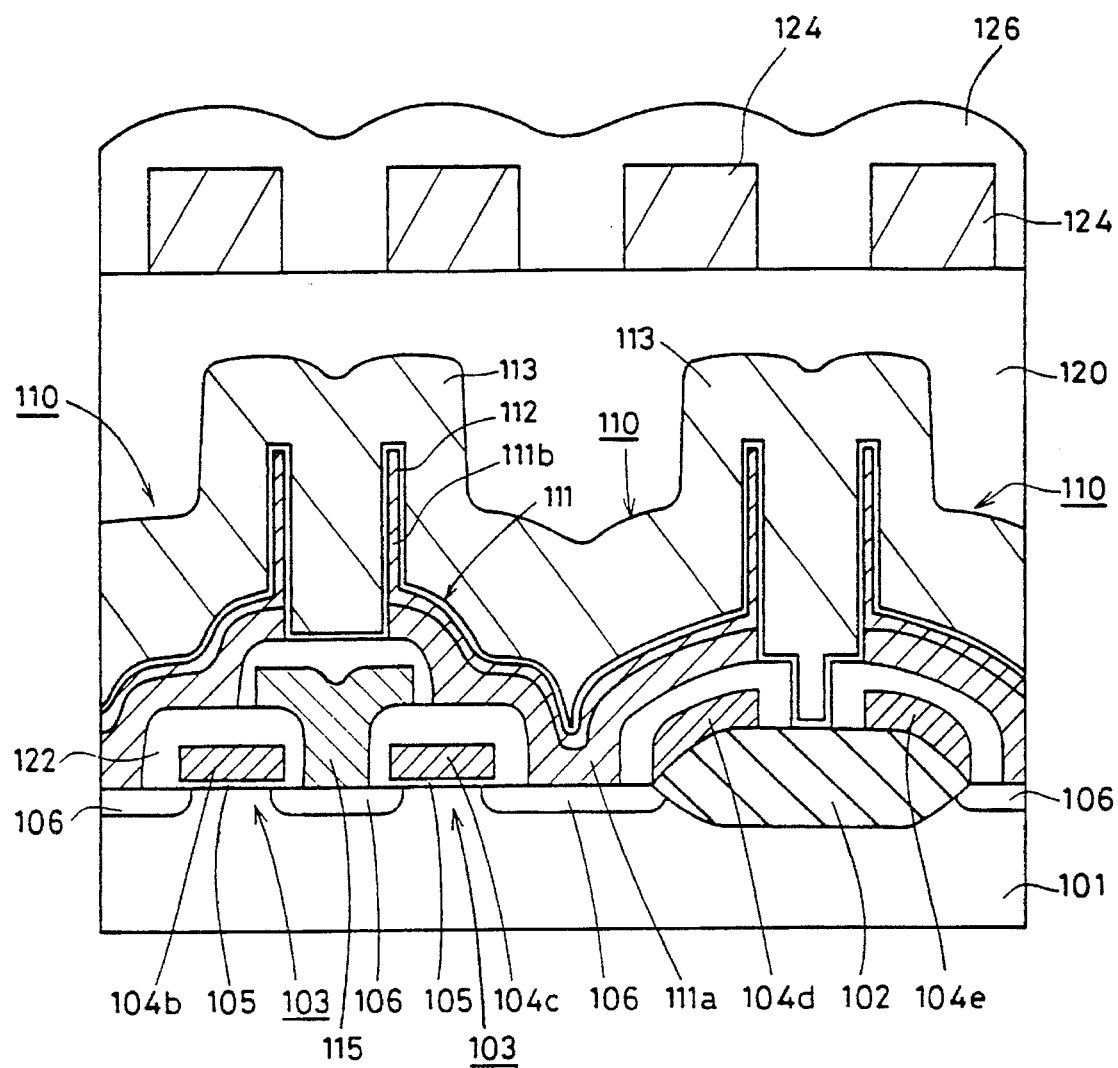
FIG. 14 is a partial sectional view showing a memory cell in a DRAM to which a capacitor according to the present invention is applied.

Description will be made of an arrangement of a memory cell for use in a DRAM to which the capacitor arrangement according to the present invention is applied with reference to FIG. 14. A memory cell comprises one transfer gate transistor 103 and one capacitor 110. Transfer gate transistor 103 includes a pair of source/drain regions 106, 106 and gate electrodes (word lines) 104b and 104c. A pair of source/drain regions 106, 106 comprising n type impurity regions are formed on the surface of a p type silicon substrate 101. Gate electrodes 104b and 104c are formed on the surface of silicon substrate 101, with a gate oxide film 105 provided therebetween, which surface is located between source/drain regions 106, 106. An outer surface of gate electrodes 104b and 104c is covered with an insulation layer 122. A bit line 115 is formed to be in contact with one of source/drain regions 106 of transfer gate transistor 103.

Capacitor 110 has a stacked layer arrangement including a lower electrode (storage node) 111, a dielectric layer 112 and an upper electrode (cell plate) 113. Dielectric layer 112 is structured as shown in FIG. 7. Lower electrode 111 comprises a base portion (first portion) 111a and a standing wall portion (a second portion) 111b. Base portion 111a is formed to be in contact with the other of source/drain regions 106 of transfer gate transistor 103. Standing wall portion 111b is formed on base portion 111a so as to vertically and upwardly extend along the outermost periphery of base portion 111a. Base portion 111a and standing wall portion 111b are integrally formed of a polycrystalline silicon layer with impurities implanted therein. Dielectric layer 112 is formed on the surface of lower electrode 111. Dielectric layer 112 is formed to cover both the inner surface and the outer surface of standing wall portion 111b of lower electrode 111. As a result, standing wall portion 11b of lower electrode 111 constitutes capacitance portions on both the inner and the outer side surfaces. Upper electrode 113 is formed on the surface of the dielectric layer 112. Upper electrode 113 is formed to substantially cover the whole surface of the memory cell array. Upper electrode 113 is formed of a polycrystalline silicon layer with impurities implanted therein. An interlayer insulation layer 120 is formed on the surface of upper electrode 113. A wiring layer 124 is formed on interlayer insulation layer 120. The surface of wiring layer 124 is covered with a protection film 126.

A method of manufacturing the memory cell shown in FIG. 14 will be described.

Figure 15A:
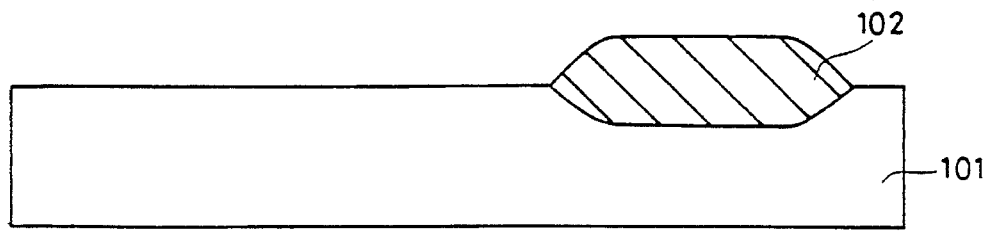
FIGS. 15A, 15B, 15C, 15D, 15E, 15F, 15G, 15H, 15I, 15J, 15K, 15L, 15M and 15N are partial sectional views showing the memory cell shown in FIG. 14 at the respective manufacturing steps.

As shown in FIG. 15A, a field oxide film 102 and a channel stop region (not shown) are formed in a predetermined region of the surface of a p type silicon substrate 101 in order to isolate element formation regions. Field oxide film 102 is formed by using a LOCOS method.

Figure 15B:
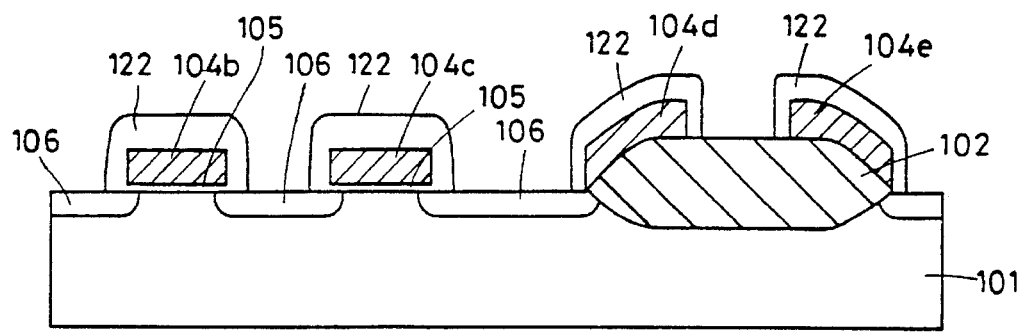

Then, as shown in FIG. 15B, a gate oxide film 105 is formed by a thermal oxidation method or the like. Thereafter, gate electrodes (word lines) 104b, 104c, 104d and 104e made of polycrystalline silicon are selectively formed by a CVD method, photolithography and etching. Then, a step of forming an oxide film and etching are carried out twice to form an insulation layer 122 to cover the outer peripheral portions of gate electrodes 104b to 104e. n type impurity ions are implanted into the surface of silicon substrate 101 by an ion implantation method by using gate electrodes 104b and 104c covered with insulation layer 122 as masks. As a result, source/drain regions 106, 106 are formed.

Figure 15C:
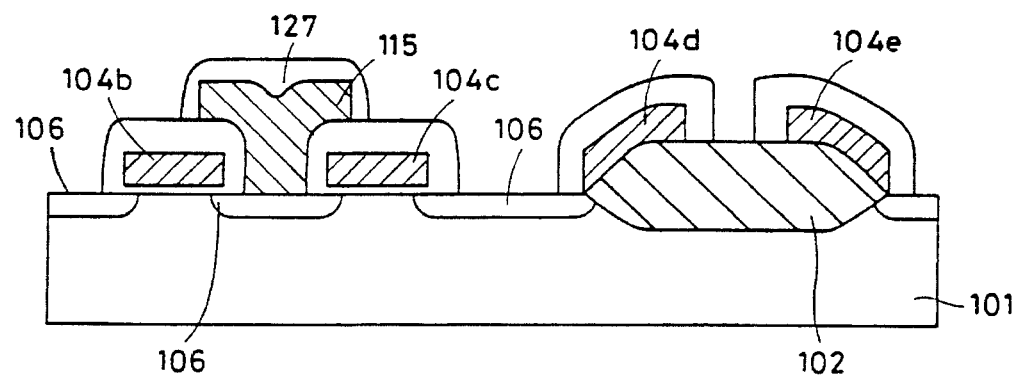

As shown in FIG. 15C, a layer of high melting point metal such as tungsten, molybdenum and titanium is formed and patterned into a predetermined configuration. As a result, a bit line 125 in direct contact with one of source/drain regions 206 of the transfer gate transistor is formed. High melting point metal silicide or polycide can be used as a material for bit line 115. The outer peripheral portion of bit line 115 is covered with an insulation layer 127.

Figure 15D:
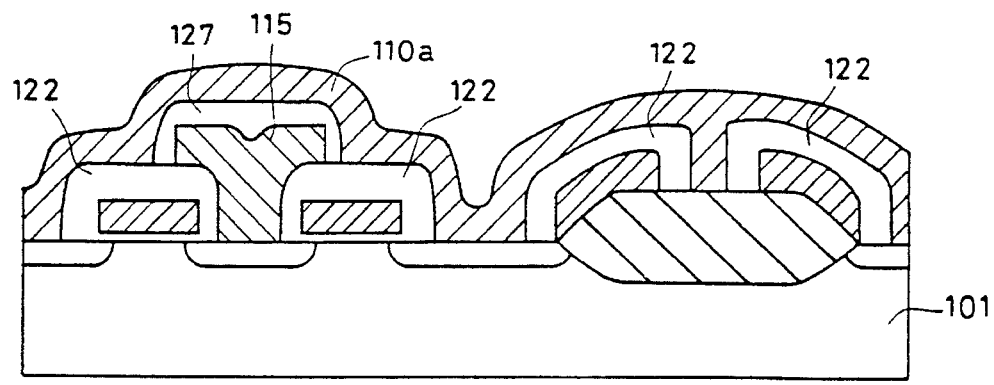

Then, as shown in FIG. 15D, a polycrystalline silicon layer 110a with impurities implanted therein is formed to cover the whole surface of silicon substrate 1 by a CVD method. Polycrystalline silicon layer 110a has impurities of $10^{20}$ /cm$^3$ or more implanted therein.

Figure 15E:
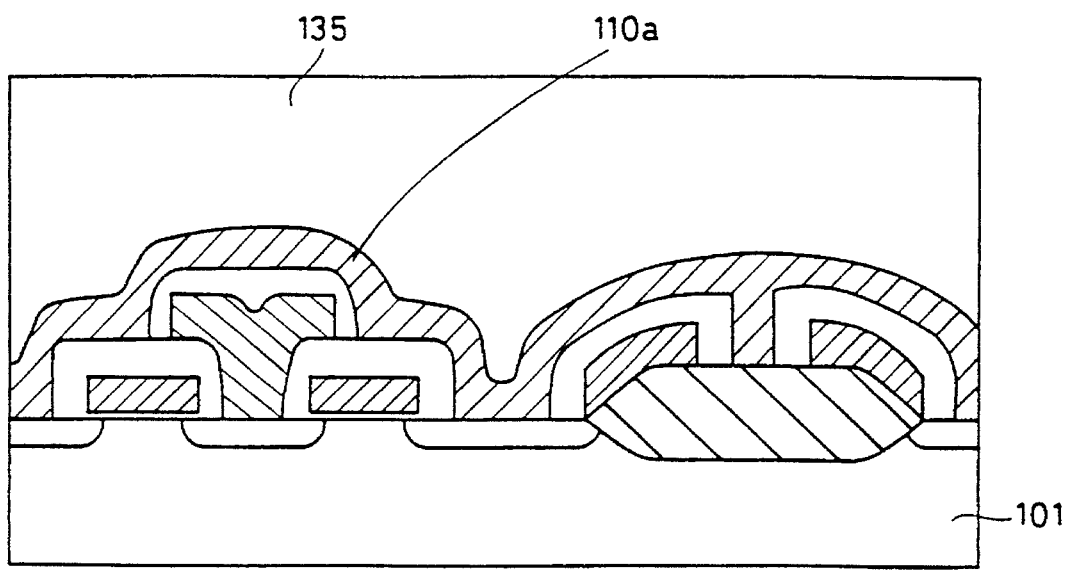

As shown in FIG. 15E, an insulation layer 135 comprising a silicon oxide film, for example, is formed thick to cover the whole surface. The film thickness of insulation layer 135 defines a height of standing wall portion 111b of a lower electrode 111 of the capacitor.

Figure 15F:
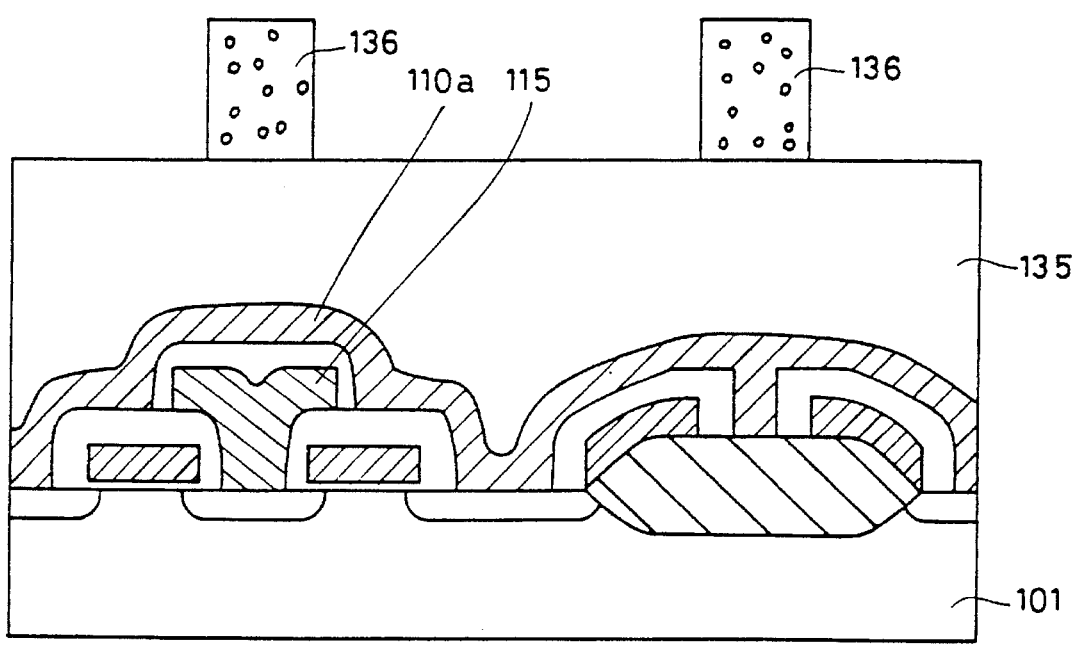

As shown in FIG. 15F, a resist 136 is applied on the surface of insulation layer 135, which is patterned into a predetermined configuration by photolithography. As a result, a pattern (capacitor isolation layer) 136 comprising resist 136 is formed. A width of resist patter 136 defines an insulation interval between adjacent capacitors.

Figure 15G:
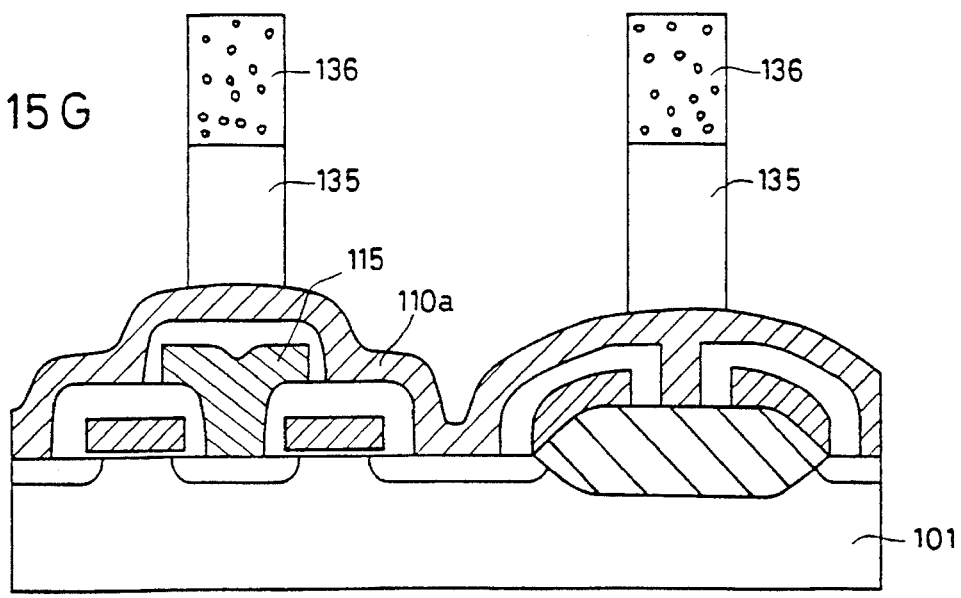

As shown in FIG. 15G, insulation layer 135 is selectively removed by using resist pattern 136 as a mask. This selective removal is carried out by anisotropic etching, for example. Wet etching can be performed in addition thereto when the width of insulation layer 135 is to be made smaller than that of resist pattern 136.

Figure 15H:
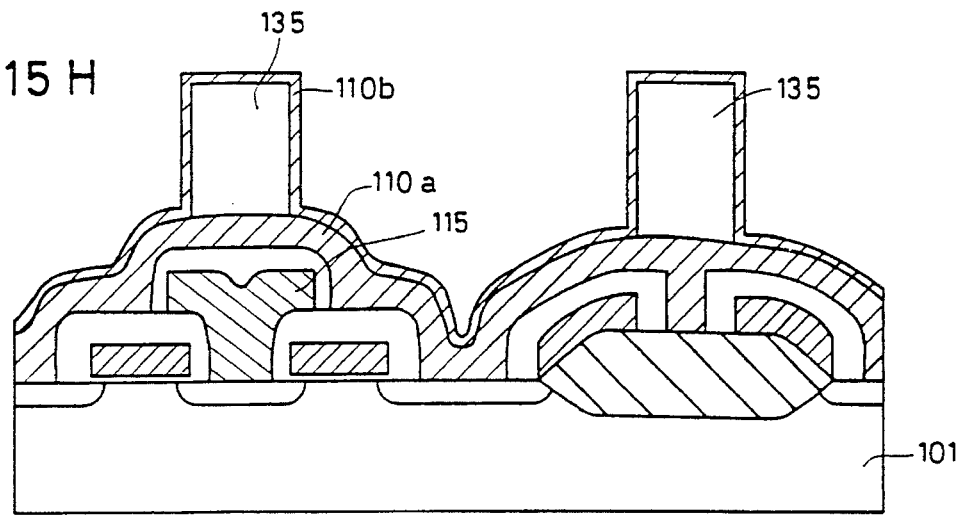

As shown in FIG. 15H, after the removal of resist pattern 136, a polycrystalline silicon layer 110b with impurities implanted therein is formed on the whole surface by a CVD method. The film thickness of polycrystalline silicon layer 110b is made to be smaller than that of first polycrystalline silicon layer 110a formed thereunder. The film thickness of polycrystalline silicon layer 110b is set to be about 500 Å, for example. Polycrystalline silicon layer 110b also has impurities having concentration of $10^{20}$ /cm$^3$ or more implanted therein.

Figure 15I:
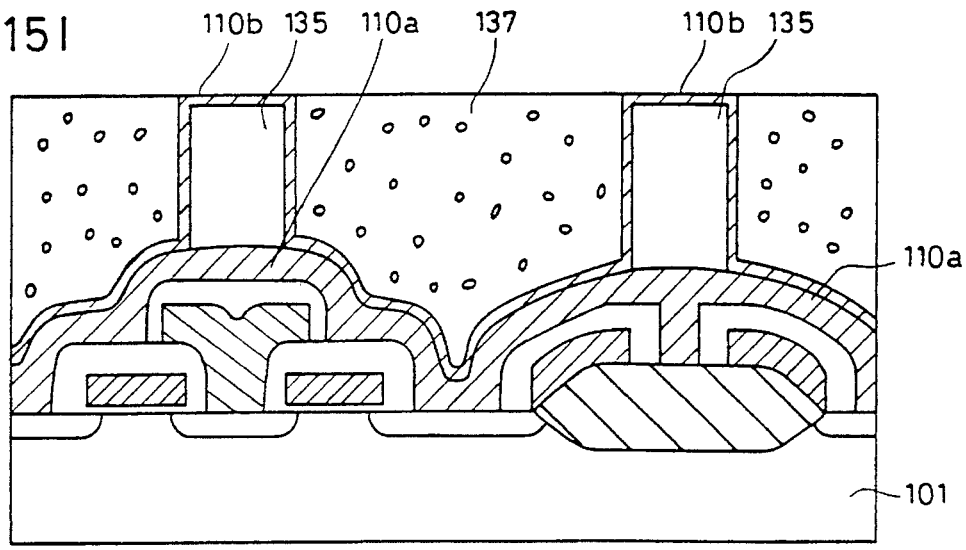

As shown in FIG. 15I, a thick resist 136 is applied to completely cover the surface of second polycrystalline silicon layer 110b. Etching back of resist 137 results in exposure of a part of second polycrystalline silicon layer 110b covering the upper surface of insulation layer 135.

Figure 15J:
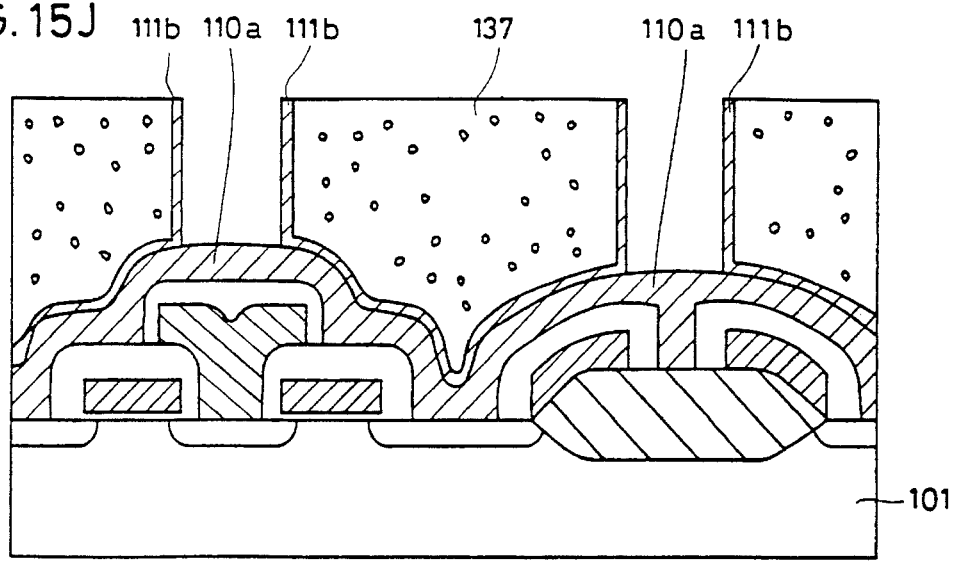

As shown in FIG. 15J, second polycrystalline silicon layer 110b exposing itself from the surface of resist 137 is removed by etching, which is followed by removal of insulation layer 135 by etching in a self-alignment manner. First polycrystalline silicon layer 110a exposes its surface at the inner portion of the opening from which opening insulation layer 135 has removed by this etching.

Figure 15K:
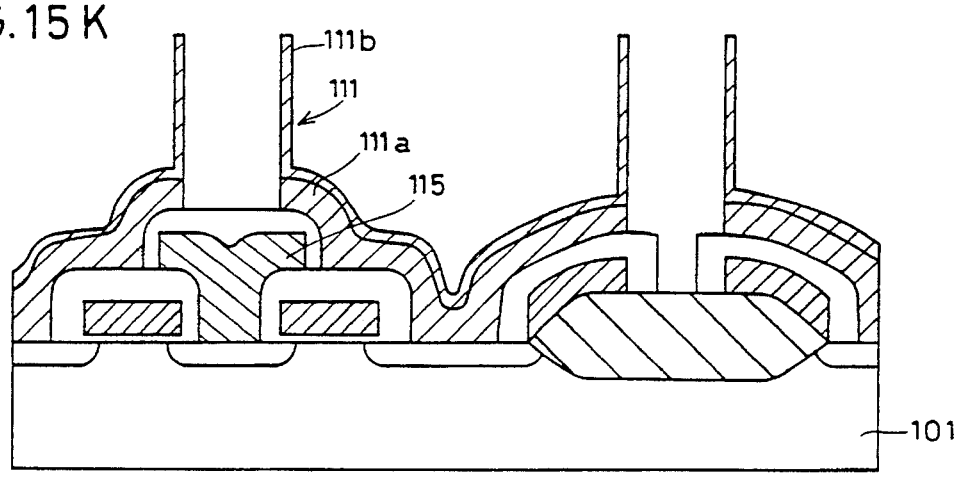

As shown in FIG. 15K, only the exposed region of polycrystalline silicon layer 110a is removed by self-alignment manner by using anisotropic etching. Thereafter, resist 137 is removed. A base portion 111a and a standing wall portion 111b of lower electrode 111 of the capacitor are formed in this step.

Figure 15L:
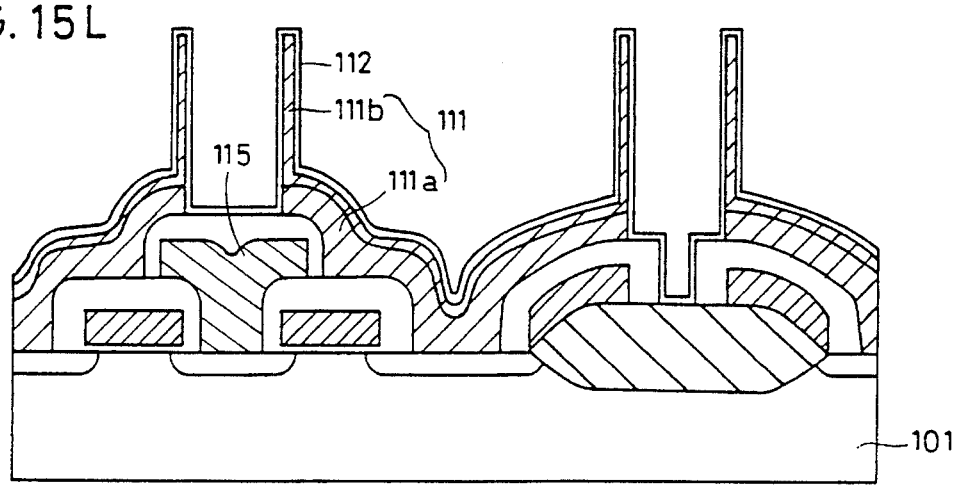

Then, as shown in FIG. 15L, a dielectric layer 112 having the structure as shown in FIG. 7 is formed on the surface of lower electrode 111 and the like.

Figure 15M:
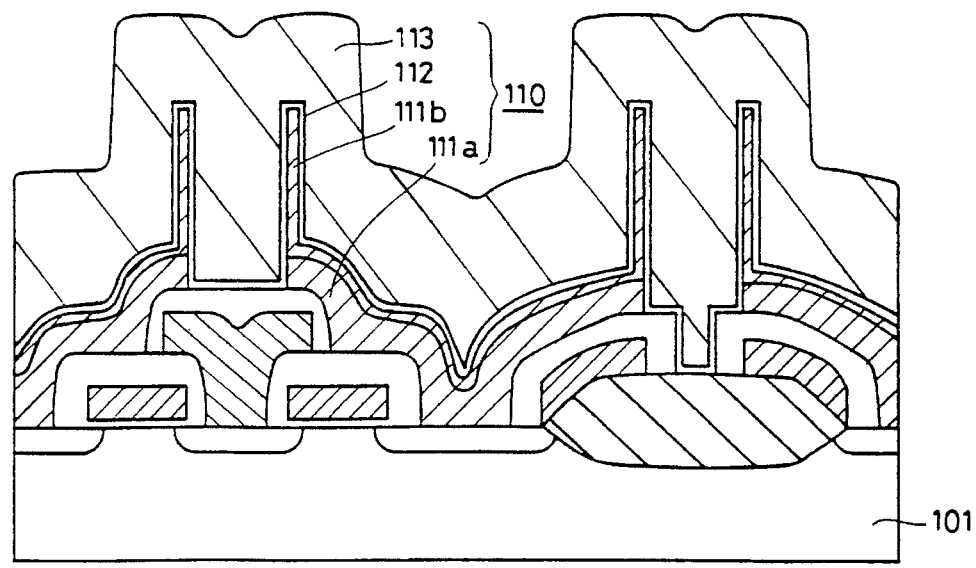

As shown in FIG. 15M, an upper electrode (cell plate) 113 comprising a conductive polycrystalline silicon layer is formed over the whole surface. The cell plate can be made of high melting point metal, for example.

Figure 15N:
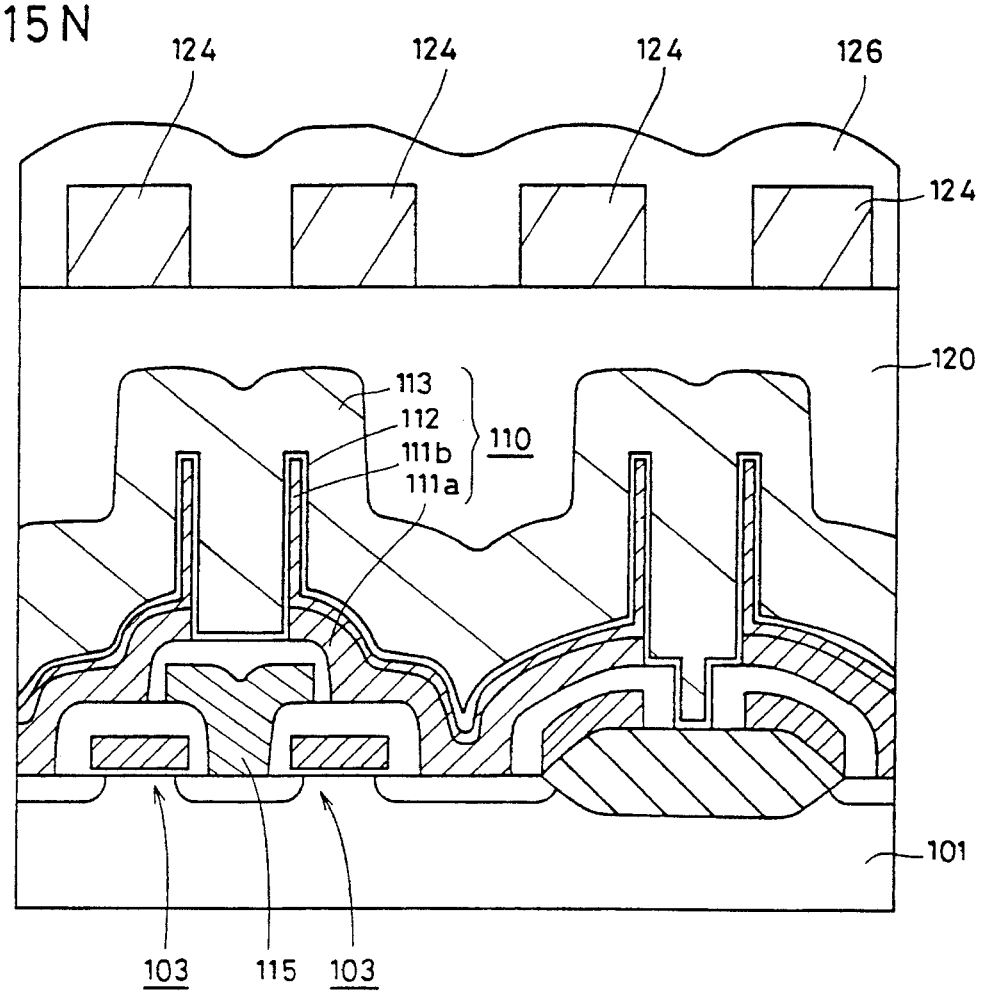

As shown in FIG. 15N, a thick interlayer insulation layer 120 is formed on upper electrode 113. A wiring layer 124 of aluminum having a predetermined configuration is formed on the surface of interlayer insulation layer 120. A protection film 126 is formed to cover the surface of wiring layer 124. A memory cell is manufactured in this way.

As described in the foregoing, the present invention provides a capacitor arrangement enabling an increase of capacitance and improvement in reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a capacitor, comprising:

a first electrode layer formed on a semiconductor substrate, a dielectric layer formed on said first electrode layer, and a second electrode layer formed on said dielectric layer, said dielectric layer including:

a silicon oxynitride film having a thickness in the range of 17 Å to 25 Å formed on said first electrode layer, a silicon nitride film having a thickness in the range of 20 Å to 50 Å formed on said oxynitride film, and a silicon oxide film formed on said nitride film and having a thickness in the range of 5 Å to less than 20 Å.

2. The semiconductor device according to claim 1, wherein said capacitor is capacitor in memory cell of DRAM.

3. A semiconductor device having a capacitor, comprising:

a first electrode layer formed on a semiconductor substrate, a dielectric layer having an overall thickness in the range of 42 Å to less than 95 Å formed on said first electrode layer, and a second electrode layer formed on said dielectric layer, said dielectric layer including:

a silicon oxynitride film formed on said first electrode layer, a silicon nitride film having a thickness in the range of 20 Å to 50 Å formed on said oxynitride film, and a silicon oxide film formed on said nitride film and having a thickness less than 20 Å.

4. The semiconductor device according to claim 3, wherein said capacitor is capacitor in memory cell of DRAM.

* * * * *